United States Patent
Yu

(10) Patent No.: US 6,225,176 B1
(45) Date of Patent: May 1, 2001

(54) STEP DRAIN AND SOURCE JUNCTION FORMATION

(75) Inventor: Bin Yu, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/255,203

(22) Filed: Feb. 22, 1999

(51) Int. Cl.$^7$ .................................................. H01L 21/336
(52) U.S. Cl. ........................ 438/305; 438/482; 438/306
(58) Field of Search ................................. 438/305, 303, 438/96, 365, 482, 308, 306

(56) References Cited

U.S. PATENT DOCUMENTS

| | | |
|---|---|---|
| 4,745,082 | 5/1988 | Kwok . |
| 4,784,718 | 11/1988 | Mitani et al. . |
| 5,264,382 | 11/1993 | Watanabe . |
| 5,374,575 | 12/1994 | Kim et al. . |
| 5,391,510 | 2/1995 | Hsu et al. . |
| 5,429,956 | 7/1995 | Shell et al. . |
| 5,675,159 | 10/1997 | Oku et al. . |
| 5,716,861 | 2/1998 | Moslehi . |
| 5,856,225 | 1/1999 | Lee et al. . |
| 5,858,843 | 1/1999 | Doyle et al. . |
| 5,953,615 | * 9/1999 | Yu .......................................... 438/303 |
| 5,953,616 | * 9/1999 | Ahn ....................................... 438/305 |
| 6,037,204 | * 3/2000 | Chang et al. ......................... 438/231 |

FOREIGN PATENT DOCUMENTS

| | | |
|---|---|---|
| 3-248433 | 11/1991 | (JP) . |
| 4-123439 | 4/1992 | (JP) . |
| 5-160396 | 6/1993 | (JP) . |

OTHER PUBLICATIONS

"International Electron Devices Meeting", IEDM 97–821, ©1997, IEEE.

* cited by examiner

Primary Examiner—Richard Elms
Assistant Examiner—Brad Smith
(74) Attorney, Agent, or Firm—Foley & Lardner

(57) ABSTRACT

A method of fabricating an integrated circuit with a step source/drain junction utilizes a triple amorphization technique. The technique creates a shallow amorphous region, an intermediate region and a deep amorphous region. The doped amorphous regions can be laser-annealed to form step-like source/drain junctions and their extensions. The process can be utilized for P-channel or N-channel metal-oxide-semiconductor field-effect transistors (MOSFETs).

21 Claims, 2 Drawing Sheets

STEP DRAIN AND SOURCE JUNCTION FORMATION

CROSS REFERENCE TO RELATED APPLICATIONS

This patent application is related to U.S. application Ser. No. 09/187,890, by Yu et al., entitled "A Method of Fabricating an Integrated Circuit with Ultra-Shallow Drain/Source Extensions", U.S. application Ser. No. 09/187,635, now U.S. Pat. No. 5,985,726 by Yu et al., entitled "A Damascene Process for Forming Ultra-Shallow Source/Drain Extensions in ULSI MOSFET", U.S. application Ser. No. 09/187,630, by Yu, entitled "Dual Amorphization Process for Ultra-Shallow Drain and Source Extensions", and U.S. application Ser. No. 09/187,172, by Yu, entitled "Recessed Channel Structure for Manufacturing Shallow Source/Drain Extensions", all filed on Nov. 6, 1998 and assigned to the assignee of the present invention. The present application is also related to U.S. application Ser. No. 09/255,546, entitled "A Locally Confined Deep Pocket Process for ULSI MOSFETS", by Yu, filed on an even date herewith and assigned to the assignee of the present invention.

FIELD OF THE INVENTION

The present invention relates to integrated circuits and to methods of manufacturing integrated circuits. More particularly, the present invention relates to transistors with ultra-shallow source/drain extensions and to transistors with a step source/drain junction.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETs). The transistors can include semiconductor gates disposed between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions (SDE) help to achieve immunity to short-channel effects which degrade transistor performance for both N-channel and P-channel transistors. Short-channel effects can cause threshold voltage roll-off and drain-induced barrier-lowering. These effects result in very leaky transistor and also degrade the robustness of the transistor to random process variations. The use of shallow source and drain extensions and, hence, controlling short-channel effects are particularly important as transistors become smaller.

Conventional techniques utilize a double implant process to form deep source/drain contact junctions and shallow source/drain extensions. According to the conventional process, the source / drain extensions are formed by providing a transistor gate structure without sidewall spacers on a top surface of a silicon substrate. The silicon substrate is doped on both sides of the gate structure via a conventional doping process, such as, a diffusion process or ion-implantation process. Without the sidewall spacers, the doping process introduces dopants into a thin region (i.e., just below the top surface of the substrate) to form the drain and source extensions, as well as, to partially form the deep drain and source regions.

After the drain and source extensions are formed, silicon dioxide or silicon nitride spacers, which abut lateral sides of the gate structure, are provided over the source and drain extensions. The substrate is doped a second time to form the deeper source and drain contact regions. The deep source/drain contact regions are used for silicidation purpose. The source and drain extensions are not further doped due to the blocking capability of the silicon dioxide or silicon nitride spacer.

Other conventional processes can utilize a single ion-implantation technique to form a uniform-depth source and drain region. The source and drain region is produced by a single ion implantation followed by a high temperature annealing process. However, it is very difficult to balance the different requirements for shallow extensions and deep contact regions.

As transistors disposed on integrated circuits (ICs) become smaller, transistors with shallow and ultra-shallow source and drain extensions have become more difficult to manufacture. Formation of ultra-shallow source and drain extensions is critical to the fabrication of ULSI MOSFETs. For example, smaller transistors should have ultra-shallow source and drain extensions (less than 30 or 40 nanometer (nm) junction depth). Forming source and drain extensions with junction depths of less than 30 nm is very difficult using conventional fabrication techniques. Due to the so-called "channeling effect" conventional ion-implantation results in a dopant profile tail distribution that extends deep into the substrate. Also, conventional ion-implantation and diffusion-doping techniques have difficulty maintaining shallow source and drain extensions because point defects generated in the bulk semiconductor substrate can cause the dopant to more easily diffuse (the so-called "Transient Enhanced Diffusion" effect, or TED). The diffusion often extends the source and drain extension vertically into the bulk semiconductor substrate.

Conventional dual-depth source and drain regions (e.g., deep source or drain region for silicide formation and shallow source/drain extension for controlling short-channel effects) can be disadvantageous. Dual-depth source and drain regions require that the design of the source/drain structure be balanced to minimize source/drain series resistance and to reduce short-channeling effects. As transistor dimensions continue to be reduced, the depth of deep S/D contact regions remains almost the same but the depth of shallow S/D extensions must be reduced. The increasing difference between the two depths makes transistor design more difficult. Making the source and drain extensions too short increases short-channeling effects; and making the source and drain extensions too long increases source/drain series resistance. Increased source and drain series resistance degrades transistor current drive and speed.

Thus, there is a need for a method of manufacturing source and drain junctions and their extensions that does not utilize a conventional double implant process. Further still, there is a need for transistors that do not have conventional deep source/drain regions and shallow source and drain extensions. Even further still, there is a need for an efficient method of manufacturing source and drain extensions that reduces design constraints posed by source/drain series resistance and short-channeling performance.

SUMMARY OF THE INVENTION

The present invention relates to a method of manufacturing an integrated circuit that includes forming at least a portion of a gate structure on a top surface of a silicon substrate, providing a first pre-amorphization implant, doping the substrate for drain and source extensions, and providing first spacers. The pre-amorphization implant creates a first amorphous region near the top surface of the substrate. The first spacers abut the gate structure. The method further includes providing a second pre-amorphization implant, doping the substrate to form intermediate source and drain regions, providing a second spacer, and providing a third dopant pre-amorphization implant. The second pre-amorphization implant creates a second amorphization region in the substrate. The second spacers abut the first spacers, and the third pre-amorphization implant creates a third amorphous region in the substrate. The method even further includes doping the substrate to form deep source and drain regions.

The present invention further relates to an ultra-large scale integrated circuit including a plurality of field effect transistors. The transistors have step source and drain junctions. The step source and drain junctions include a shallow source/drain extension, an intermediate extension region, and a deep source/drain junctions region. The intermediate extension region is shallower than the deep source/drain region and deeper than the shallow source/drain extension.

The present invention even further relates to a step source/drain region for a field effect transistor associated with an ultra-large scale integrated circuit. The step source/drain region is manufactured by a method comprising forming at least a portion of a gate structure on a top surface of a substrate, providing a first amorphization implant, doping the substrate for a shallow source/drain extension, providing first spacers, providing a second amorphization implant, doping the substrate for an intermediate region, providing second spacers, providing a third amorphization implant, doping the substrate for a deep source/drain region, and thermally annealing the substrate. The first amorphization implant creates a first amorphous semiconductor region near the top surface of the substrate, and the second amorphization region creates an intermediate amorphous semiconductor region in the substrate. The third amorphization implant creates a deep amorphous region in the semiconductor substrate.

DETAILED DESCRIPTION OF THE PREFERRED EXEMPLARY EMBODIMENTS

Figure 1:
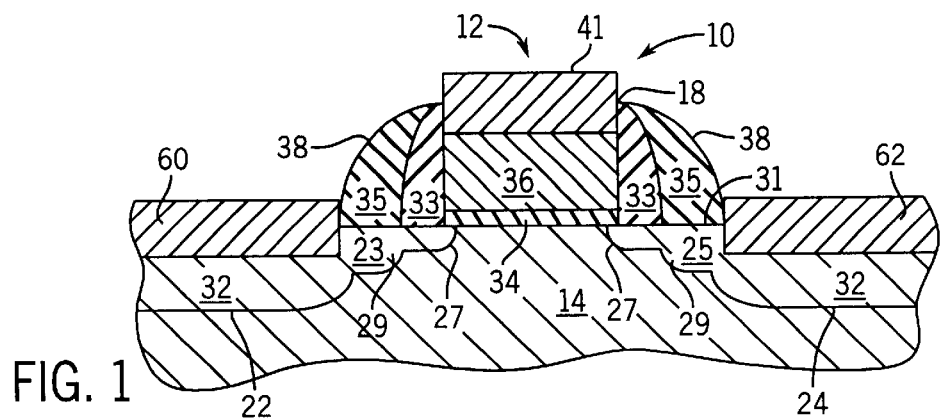
FIG. 1 is a cross-sectional view of a portion of an integrated circuit having a transistor with step source/drain junctions in accordance with an exemplary embodiment of the present invention.

With reference to FIG. 1, a portion 10 includes a transistor 12 that is disposed on a semiconductor substrate 14, such as, a single crystal silicon wafer. Transistor 12 is part of an integrated circuit (IC) manufactured on a wafer (such as, a silicon wafer). Transistor 12 includes a gate structure 18, a step source region 22 having an extension 23, and a step drain region 24 having an extension 25. Regions 22 and 24 have a junction depth of at least 70–100 nm below a surface 31 of substrate 14. Substrate 14 can be a silicon-on-insulator (SOI) substrate, a silicon bulk substrate, a gallium arsenide (GaAs) substrate, or other semiconductor material.

Regions 22 and 24 of transistor 12 each includes an ultra-shallow region 27, an intermediate region 29, and a deep source/drain region 32. Regions 29 are more shallow than regions 32 and deeper than regions 27. Extensions 23 and 25 are connected to regions 22 and 24, respectively, and are disposed partially underneath a gate oxide 34. Regions 27 preferably have a junction depth of 15–30 nm below surface 31.

Regions 29 preferably have a junction depth of less than 60 nm (preferably 40 nm) nm below top surface 31 of substrate 14. Ultra-shallow regions 27 of extensions 23 and 25 help transistor 12 achieve substantial immunity to short-channel effects. Short-channel effects can degrade performance of transistor 12, as well as the manufacturability of the IC associated with transistor 12.

Regions 22 and 24 have a step structure that advantageously allows a deep source/drain contact junction (regions 32) to be formed and allows shallow region 27 to be formed partially underneath gate structure 18. Transistor 12 can be an N-channel or a P-channel field effect transistor, such as, a metal oxide semiconductor field effect transistor (MOSFET). Transistor 12 is preferably part of an ultra-large scale integrated (ULSI) circuit that includes one million or more transistors.

Gate structure 18 includes a pair of spacers 38, gate oxide 34, and a polysilicon gate conductor 36. Gate oxide 34 is preferably thermally grown on substrate 14 as a silicon dioxide layer. Gate oxide 34 can be from 2–5 nm thick. Spacers 38 and conductor 36 are preferably deposited by chemical vapor deposition (CVD) and etched to form the particular structures for transistor 12.

Spacers 38 are preferably a dual-spacer structure formed of silicon dioxide or silicon nitride ($Si_3N_4$). Each of spacers 38 includes a spacer 33 and a spacer 35. Spacer 33 is 10–30 nm wide; spacer 35 is 20–40 nm wide. Spacers 38 are 100–200 nm high.

A silicide layer 41 is disposed over gate conductor 36. A silicide layer 60 is also disposed over source region 22, and a silicide layer 62 is disposed over drain region 24. Layers 41, 60, and 62 are preferably 20–30 nm thick layers of titanium silicide ($TiSi_2$), cobalt silicide ($CoSi_2$), or other conductive materials. Sixty percent (12–18 nm) of layers 60 and 62 extends below top surface 31 of substrate 14. Layer 41 is similar to layers 60 and 62.

Most elements of transistor 12 can be manufactured according to conventional complementary metal oxide semiconductor (CMOS) process steps. Transistor 12 can be at least partially covered by an insulative layer in a CVD TEOS process and is preferably part of an ultra-large scale integrated (ULSI) circuit that includes 1,000,000 or more transistors.

Figure 2:
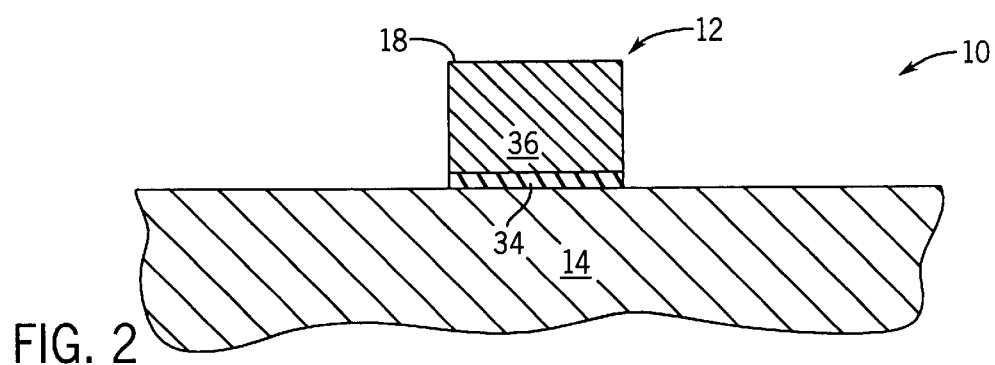
FIG. 2 is a cross-sectional view of the portion of the integrated circuit illustrated in FIG. 1, showing a gate stack formation.

With reference to FIGS. 1–5, the fabrication of transistor 12, including step regions 22 and 24, is described below as follows. In FIG. 2, transistor 12 can be substantially formed by conventional semiconductor processing techniques to form gate structure 18, including gate oxide 34 and gate conductor 36. Oxide 34 can be replaced with a silicon nitride ($Si_3N_4$) layer deposited by chemical vapor deposition (CVD). Preferably, oxide 34 is thermally grown silicon dioxide and has a thickness of 2–5 nm.

Conductor 36 has a thickness of 100–200 nm and can be a refractory metal, doped polysilicon, doped polysilicon-germanium, or other conductive material. Conductor 36 can be deposited by CVD. Conductor 36 and oxide 34 can be selectively etched to form gate structure 18. Etching can be accomplished in a conventional photolithographic process.

Figure 3:
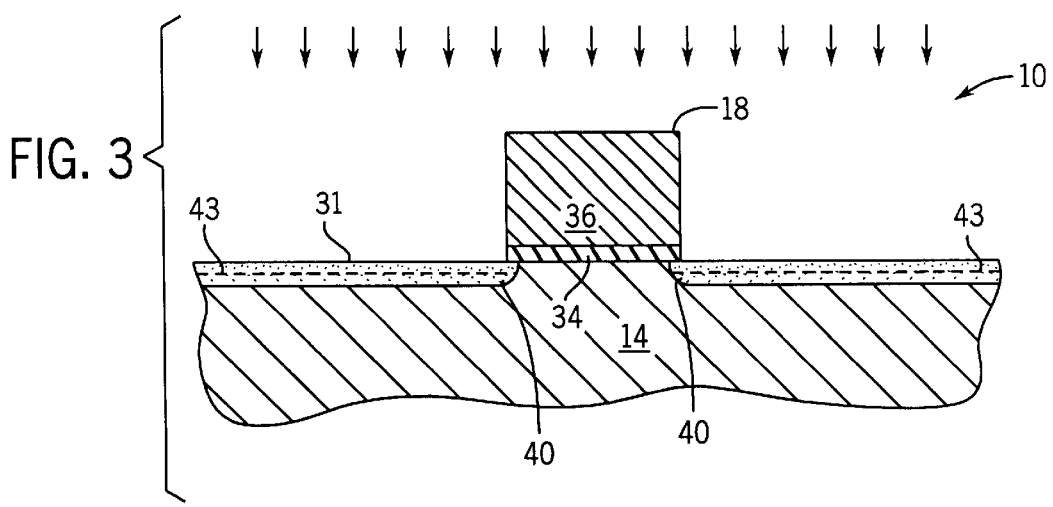
FIG. 3 is a cross-sectional view of the portion of the integrated circuit illustrated in FIG. 1, showing a first pre-amorphization implant step and a first dopant implant step.
Figure 4:
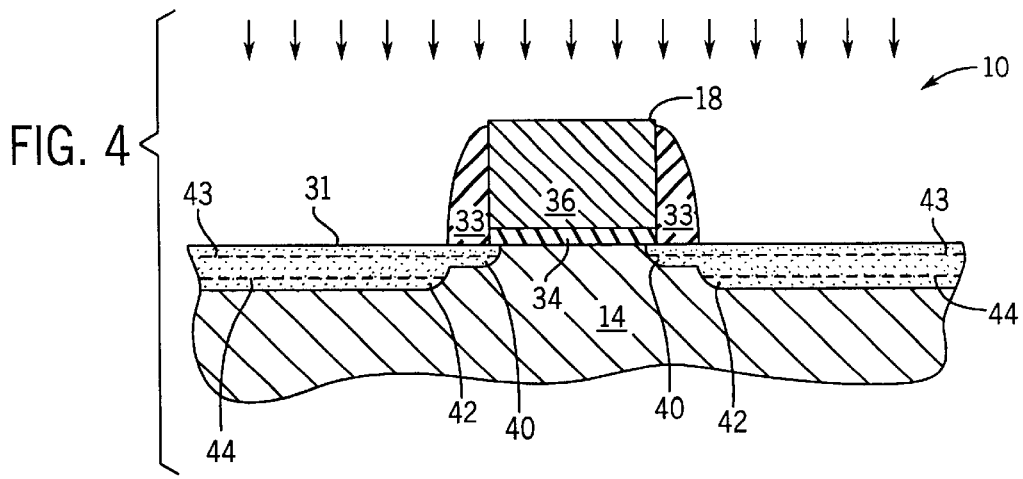
FIG. 4 is a cross-sectional view of the portion of the integrated circuit illustrated in FIG. 1, showing a second pre-amorphization implant and second dopant implant step.
Figure 5:
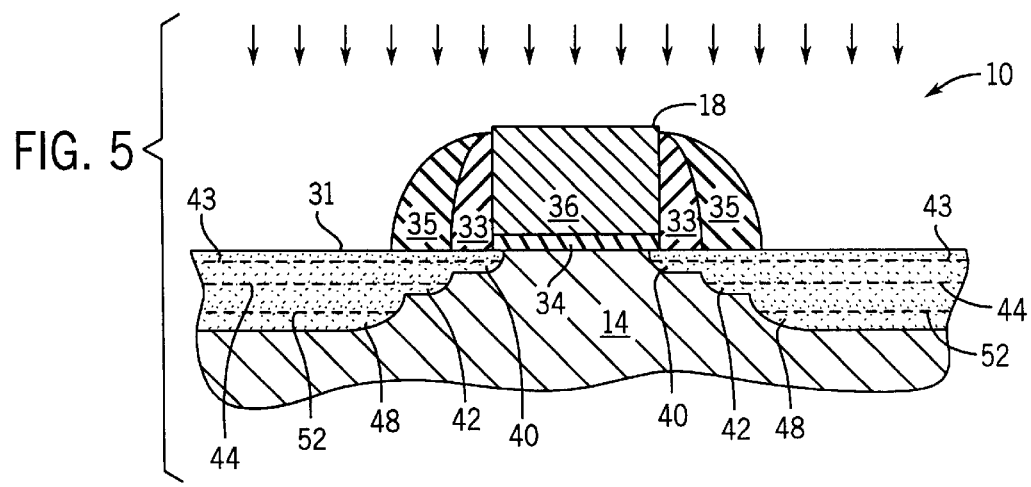
FIG. 5 is a cross-sectional view of the portion of the integrated circuit illustrated in FIG. 1, showing a third pre-amorphization implant step and dopant implant step.

Portion 10 and substrate 14 are subjected to a first pre-amorphization implant (PAI-1) to form an amorphous implant region 40 (demonstrated by a stippled area in FIGS. 3, 4, and 5). Implant region 40 is preferably amorphous silicon provided between 10–30 nm below top surface 31 of substrate 14. Region 40 can be created by subjecting substrate 14 to an ion-implantation technique. Ion implantation can be performed by implantation devices manufactured by companies, such as, Varian Company of Palo Alto, Calif., Genius Company, and Applied Materials, Inc.

Region 40 is preferably a thin amorphous region or layer of substrate 14. The ion-implantation technique can charge semiconductor ions (preferably, electrically neutral species), such as, silicon, germanium, or xenon ions, to approximately 5–100 kiloelectron volts (keVs) and implant them into substrate 14. The silicon and germanium ions change the single-crystal silicon associated with substrate 14 into amorphous silicon at region 40.

PAI-1 preferably charges germanium ions to 5 KeV–30 KeV to implant a dose of $2$–$4 \times 10^{14}$ dopants/cm$^2$ at a depth of 15–30 nm below surface 31. After the PAI-1, substrate 14 is subjected to a dopant implant 43, represented by the dashed line below surface 31 in FIGS. 3, 4 and 5. The dashed line represents peak dopant concentration. The dopant which is implanted can be arsenic, boron difluoride (BF$_2$), indium, phosphorous, or any appropriate dopant for semiconductor fabrication operations. Implant 43 can be performed at a dose of $10^{14-15}$ dopants/cm$^2$ and can be phosphorus (P), arsenic (As) or antimony (Sb) for N-channel transistors and boron (B) or Indium (In) for P-channel transistors. The high concentration of dopants allows region 27 (FIG. 1) to effectively reduce series resistance. Preferably, dopants are implanted at low KeV energy levels (e.g., 1 KeV for As or BF$_2$). Implant 43 is preferably 7.5–15 nm below surface 31 (e.g., half the depth of region 40). Alternatively, other dopants, such as, BF$_2$, P, or other ions can be utilized.

With reference to FIG. 3, spacer material which is silicon dioxide or silicon nitride, is deposited in a conventional process to form spacers 33. The material for spacers 33 can be deposited in plasma enhanced chemical vapor deposition (PECVD) process as a 100 to over 200 nm thick layer. The layer is then selectively etched to leave spacers 33 adjacent or abutting gate structure 18. Spacers 33 are preferably 100–200 nm thick, and each spacer 33 is approximately 10–30 nm (e.g., 20 nm) wide. Alternatively, other spacer materials, such as, silicon oxinitride or other insulative materials, can be utilized.

With reference to FIG. 4, after spacers 33 are formed, portion 10 and substrate 14 are subjected to a second pre-amorphization implant (PIA-2) to form an amorphous implant region 42. The PIA-2 implant preferably utilizes species or ions similar to the PAI-1 implant. The PIA-2 implant preferably forms an amorphous region 42 at a depth of approximately 40–60 nm from surface 31.

Region 42 is formed by subjecting substrate 14 to an ion-implantation technique, wherein silicon, germanium, or xenon ions are implanted to a depth between 40–60 nm from surface 31. Region 42 is represented as a stippled area in FIGS. 4 and 5. The implantation technique for forming region 42 is similar to the technique for forming region 40, discussed with reference to FIG. 2, except that the ions used to form regions 42 are more highly charged (e.g., 40 KeV for Ge ions). Ge ions are preferably implanted at a dose of $2$–$4 \times 10^{14}$ dopants/cm$^2$.

After regions 42 are formed by PAI-2, substrate 14 is subjected to a dopant implant 44 represented by a dashed line below implant 43 in FIGS. 3 and 4. Implant 44 is similar to implant 43. Implant 44 is 20–30 nm below surface 31 (half the depth of region 42). Spacer 33 protects the portions of substrate 14 underneath from the PAI-2 and the second dopant implant, thereby leaving ions underneath spacer 33 ultra-shallow in depth. Implant 44 preferably provides a n- or p-type dopant concentration of $10^{19}$ dopants/cm$^3$.

In FIG. 5, spacers 35 are formed adjacent (e.g., abut) spacers 33. Spacers 35 are formed in a similar process as spacers 33. Preferably, a layer of silicon dioxide or silicon nitride is deposited and etched back to leave spacers 35 adjacent spacers 33. Spacers 35 are preferably 100–200 nm high and 20–40 nm wide (e.g., 30 nm wide).

After spacers 35 are formed, portion 10 and substrate 14 are subjected to a third pre-amorphization implant (PAI-3) similar to the PAI-1 and PAI-2, discussed with reference to FIGS. 3 and 4. PAI-3 forms a deeper amorphous region 48 in substrate 14 (regions which are not covered by gate structure 18 or spacers 33 and spacers 35). Amorphization region 48 is represented by a dotted area in FIG. 5. Region 48 is preferably 70–100 nm below top surface 31 of substrate 14. Region 48 is formed by charging Ge ions to 60 KeV at a dose of $10^{15}$ dopants/cm$^2$.

After region 48 is formed, substrate 14 is subjected to a dopant implant 52 similar to dopant implants 43 and 44, discussed with reference to FIGS. 3 and 4. The dopant implant forms a region 52. Spacers 33 and 35 protect covered areas of substrate 14 from dopant implant 52, thereby preserving regions 27 and 29 from further ions. Region 52 is represented by a dashed line in FIG. 5, which represents the peak dopant implant. Region 52 is 35–50 nm (e.g., half the depth of region 48) below surface 31. Region 52 can be formed by providing n- or p-type dopants to a concentration of $10^{19}$ dopants/cm$^3$.

With reference to FIG. 5, substrate 14 is preferably subjected to an excimer laser-annealing, although other annealing processes can be utilized. Amorphous silicon regions 40, 42, and 48 are melted during laser pulse exposure, where local temperature near surface 31 can reach 900–1000° C. Preferably, only amorphous silicon associated with regions 40, 42, and 48 is melted, while crystal silicon in portion 10 is not. Amorphous silicon in regions 40, 42, and 48 is re-crystallized as polysilicon during the cooling down process.

Dopants in regions 43, 44, and 52 diffuse evenly in the liquid state to form a box-like (e.g., uniform) concentration profile in source region 22 and drain region 24. The box-like dopant profile helps to reduce the sheet resistance in regions 22 and 24, as well as extensions 23 and 25, respectively. Laser-annealing provides an additional advantage because it is a non-equilibrium process. Accordingly, the dopant implanted into regions 22 and 24 can exceed solid-solubility limits. Additionally, the use of multiple dopant implants introduces higher dopant concentrations that can then be realized by conventional implant and thermal-anneal processes in which dopant concentration is limited by solid solubility.

In FIG. 1, portion 10 is subjected to a conventional silicidation process to form silicide layers 41, 60, and 62. Layers 41, 60, and 62 can be formed in a conventional process, wherein a refractory metal (e.g., Co, Ti, Ni) is deposited by CVD and reacted with exposed surfaces of silicon associated with conductor 36, region 22, and region 24. Atoms of the refractory metal react with the exposed silicon (e.g., in a thermal process) to form silicide material. After the reaction, the unreacted refractory metal is removed. Layers 41, 60, and 62 advantageously reduce contact resistance. The refractory metal on spacers 38 cannot react with exposed silicon. Therefore, silicide is not formed on spacers 38.

It is understood that, while preferred embodiments, examples, materials, and values are given, they are for the purpose of illustration only. The apparatus and method of the invention are not limited to the precise details and conditions disclosed. For example, although specific triple implant fabrication methods are discussed, other triple amorphization techniques and methods could utilize the principles of the present invention to create step drain regions. Further, the dopant levels and concentrations are given as examples only. Thus, changes may be made to the details disclosed without departing from the spirit of the invention, which is defined by the following claims.

What is claimed is:

1. A method of manufacturing an integrated circuit, comprising:

forming at least a portion of a gate structure on a top surface of a silicon substrate;

providing a first pre-amorphization implant, the first pre-amorphization implant creating a first amorphous region near the top surface of the substrate;

doping the first amorphous region for drain and source extensions;

providing first spacers, the first spacers abutting the gate structure;

providing a second pre-amorphization implant, the second pre-armorphization implant creating a second amorphous region in the substrate;

doping the second amorphous region to form intermediate source and drain regions;

providing second spacers, the second spacers abutting the first spacers;

providing a third pre-amorphization implant, the third pre-amorphization implant creating a third amorphous region in the substrate; and doping the third amorphous region to form deep source and drain regions.

2. The method of claim 1, wherein the third amorphous region is 70–100 nm below the top surface.

3. The method of claim 2, wherein the second amorphous region is between 40 nm and 60 nm below the top surface.

4. The method of claim 3, wherein the first amorphous region is 10–30 nm below the top surface.

5. The method of claim 3, wherein the dopants are boron or phosphorous.

6. The method of claim 1, wherein the first and second spacers are silicon nitride.

7. The method of claim 1, further comprising:

rapidly annealing the substrate.

8. The method of claim 1, wherein the first spacers are each 30 nm wide, and the second spacers are each 30 nm wide.

9. The method of claim 7, wherein the rapidly annealing step is performed with an excimer laser.

10. A method of manufacturing an ultra-large scale integrated circuit including a plurality of field effect transistors, the transistors having a step source drain regions, the method comprising:

forming at least a portion of a gate structure on a top surface of a substrate;

providing a first pre-amorphization implant, the first pre-amorphization implant creating a first amorphous region near the top surface of the substrate;

doping the first amorphous region for drain and source extensions;

providing first spacers, the first spacers abutting the gate structure;

providing a second pre-amorphization implant, the second pre-amorphization implant creating a second amorphous region in the substrate;

doping the second amorphous region to form intermediate source and drain regions;

providing second spacers, the second spacers abutting the first spacers;

providing a third pre-amorphization implant, the third pre-amorphization implant creating a third amorphous region in the substrate; and doping the third amorphous region to form deep source and drain regions.

11. The method of claim 10, wherein the third amorphous region is 70–100 nm below the top surface.

12. The method of claim 11, wherein the second amorphous region is between 40 nm and 60 nm below the top surface.

13. The method of claim 12, wherein the first amorphous region is 10–30 nm below the top surface.

14. The method of claim 12, wherein the dopants are boron or phosphorous.

15. The method of claim 10, wherein the first and second spacers are oxide or silicon nitride.

16. The method of claim 10, further comprising:

rapidly annealing the substrate.

17. The method of claim 16, wherein the rapidly annealing step is performed with an excimer laser.

18. The method of claim 10, wherein the first spacers are each 30 nm wide, and the second spacers are each 30 nm wide.

19. A method of manufacturing an integrated circuit including an FET with step source drain regions, the method comprising.

forming at least a portion of a gate structure on a top surface of a silicon substrate;

providing a first germanium pre-amorphization implant, the pre-amorphization implant creating a first amorphous region near the top surface of the substrate;

doping the first amorphous region for drain and source extensions;

providing first spacers, the first spacers abutting the gate structure;

providing a second germanium pre-amorphization implant, the second pre-amorphization implant creating a second amorphous region in the substrate;

doping the second amorphous region to form intermediate source and drain regions;

providing second spacers, the second spacers abutting the first spacers;

providing a third germanium pre-amorphization implant, the third pre-amorphization implant creating a third amorphous region in the substrate; and doping the third amorphous region to form deep source and drain regions wherein the third amorphous region is 70–100 nm below the top surface;

wherein the second amorphous region is between 40 nm and 60 nm below the top surface; and wherein the first amorphous region is 10–30 nm below the top surface.

20. The method of claim 19, further comprising, rapidly annealing the substrate.

21. The method of claim 19, wherein the first spacers are each 30 nm wide, and the second spacers are each 30 nm wide.

* * * * *